United States Patent
Yilmaz et al.

(10) Patent No.: US 9,054,091 B2
(45) Date of Patent: Jun. 9, 2015

(54) HYBRID PACKAGED LEAD FRAME BASED MULTI-CHIP SEMICONDUCTOR DEVICE WITH MULTIPLE SEMICONDUCTOR CHIPS AND MULTIPLE INTERCONNECTING STRUCTURES

(71) Applicants: Hamza Yilmaz, Saratoga, CA (US); Yan Xun Xue, Los Gatos, CA (US); Jun Lu, San Jose, CA (US); Peter Wilson, Lathrop, CA (US); Yan Huo, Shanghai (CN); Zhiqiang Niu, Santa Clara, CA (US); Ming-Chen Lu, Shanghai (CN)

(72) Inventors: Hamza Yilmaz, Saratoga, CA (US); Yan Xun Xue, Los Gatos, CA (US); Jun Lu, San Jose, CA (US); Peter Wilson, Lathrop, CA (US); Yan Huo, Shanghai (CN); Zhiqiang Niu, Santa Clara, CA (US); Ming-Chen Lu, Shanghai (CN)

(73) Assignee: Alpha & Omega Semiconductor, Inc., Sunnyvale, CA (US)

( * ) Notice: Subject to any disclaimer, the term of this patent is extended or adjusted under 35 U.S.C. 154(b) by 44 days.

(21) Appl. No.: 13/913,770

(22) Filed: Jun. 10, 2013

(65) Prior Publication Data
US 2014/0361420 A1    Dec. 11, 2014

(51) Int. Cl.

| | |
|---|---|
| *H01L 23/495* | (2006.01) |
| *H01L 23/48* | (2006.01) |
| *H01L 23/52* | (2006.01) |
| *H01L 23/02* | (2006.01) |
| *H01L 23/34* | (2006.01) |
| *H01L 23/00* | (2006.01) |
| H01L 23/31 | (2006.01) |
| H01L 21/56 | (2006.01) |

(52) U.S. Cl.
CPC ....... *H01L 23/49524* (2013.01); *H01L 23/3107* (2013.01); *H01L 23/49537* (2013.01); *H01L 23/49562* (2013.01); *H01L 23/49575* (2013.01); H01L 21/561 (2013.01); H01L 2224/0401 (2013.01); H01L 2224/04026 (2013.01); H01L 2224/06181 (2013.01); H01L 2224/32245 (2013.01); H01L 2224/73104 (2013.01); H01L 2224/94 (2013.01); H01L 2924/13091 (2013.01); H01L 2224/40137 (2013.01); H01L 2224/4103 (2013.01); H01L 2224/40245 (2013.01); *H01L 24/40* (2013.01)

(58) Field of Classification Search
CPC .......... H01L 2224/48091; H01L 2224/48247; H01L 2924/14; H01L 2924/01079; H01L 2924/15312; H01L 23/49811
USPC ......... 257/676, 685, 690, 692, 693, 696, 697, 257/723
See application file for complete search history.

(56) References Cited

U.S. PATENT DOCUMENTS

| | | | |
|---|---|---|---|
| 7,052,938 B2 * | 5/2006 | Estacio et al. ................ | 438/123 |
| 7,777,315 B2 * | 8/2010 | Noquil ........................... | 257/678 |
| 2008/0224300 A1 * | 9/2008 | Otremba ....................... | 257/693 |
| 2012/0326287 A1 * | 12/2012 | Joshi et al. ................... | 257/676 |

* cited by examiner

*Primary Examiner* — A. Sefer
*Assistant Examiner* — Dilinh Nguyen
(74) *Attorney, Agent, or Firm* — Chein-Hwa Tsao; CH Emily LLC (57) ABSTRACT

A hybrid packaging multi-chip semiconductor device comprises a lead frame unit, a first semiconductor chip, a second semiconductor chip, a first interconnecting structure and a second interconnecting structure, wherein the first semiconductor chip is attached on a first die paddle and the second semiconductor chip is flipped and attached on a third pin and a second die paddle, the first interconnecting structure electrically connecting a first electrode at a front surface of the first semiconductor chip and a third electrode at a back surface of the second semiconductor chip and a second electrode at the front surface of the first semiconductor chip is electrically connected by second interconnecting structure.

18 Claims, 10 Drawing Sheets

HYBRID PACKAGED LEAD FRAME BASED MULTI-CHIP SEMICONDUCTOR DEVICE WITH MULTIPLE SEMICONDUCTOR CHIPS AND MULTIPLE INTERCONNECTING STRUCTURES

FIELD OF THE INVENTION

The invention generally relates to a power device, particularly relating to a thin power device with improved heat dissipation and a preparation method thereof.

DESCRIPTION OF THE RELATED ART

Figure 1A:
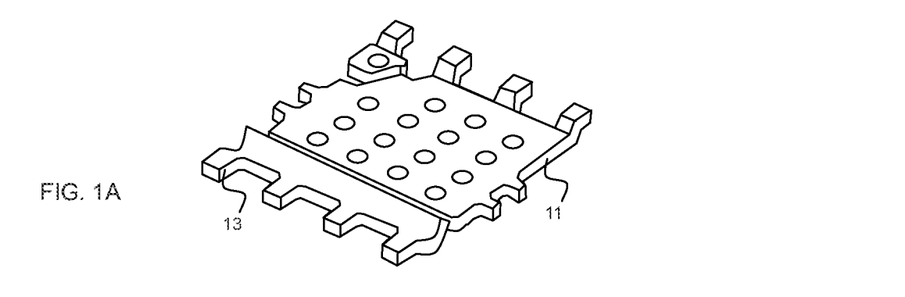
FIGS. 1A to 1C illustrate the steps of forming a single-chip power device in the background art.
Figure 1B:
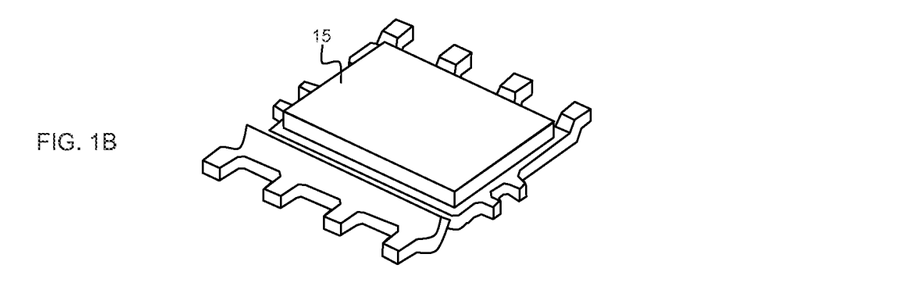
Figure 1C:
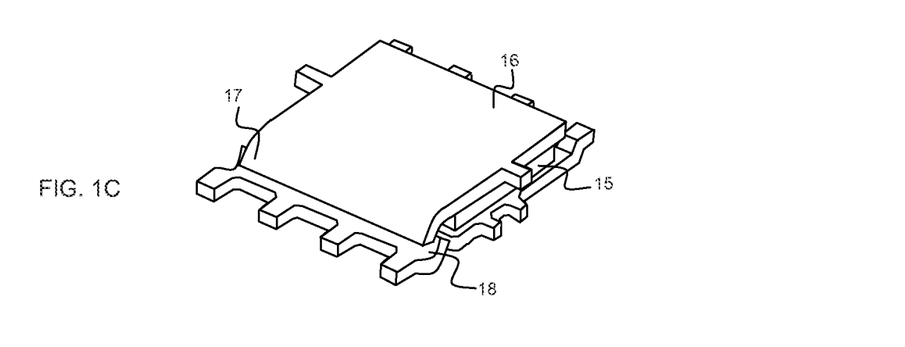
Figure 2:
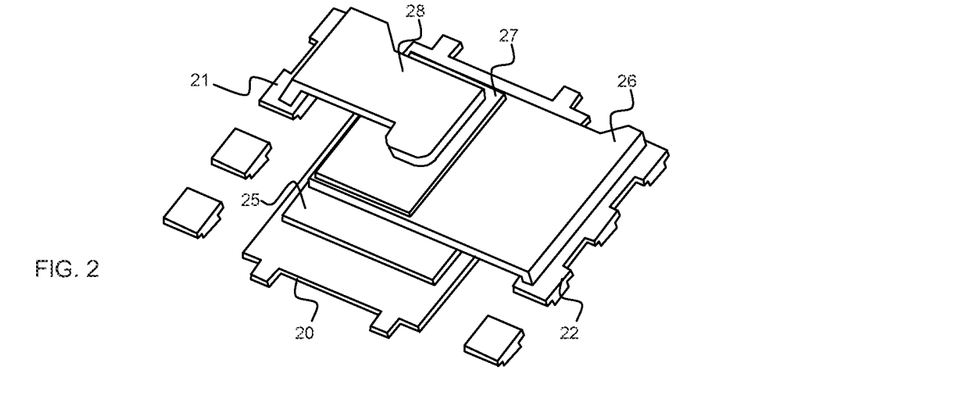
FIG. 2 illustrates a stacked double-chip power device in the background art.

Traditionally, wire bonding or metal clip is used for interconnection in a power device. For example, as shown in FIGS. 1A to 1C disclosed in U.S. Pat. No. 6,870,254B1, a chip 15 is attached on a lead frame 11, then a metal clip 16 is attached on the chip 15 for connecting the electrode of the chip 15 with a pin 13 located close to the lead frame 11, where one side of the metal clip 16 is bent downward to mechanically and electrically connected to a V-groove 18 of the pin 13. The heat dissipation performance of the single-chip package shown in FIG. 1C is good, but the heat dissipation performance of a stacked multi-chip package such as a DC-DC converter including a high-side MOSFET (Metal-Oxide-Semiconductor Field Effect Transistor) and a low-side MOSFET is poor. As shown in FIG. 2, a low-side MOSFET 25 is attached on a paddle 20, and then a metal clip 26 is attached on the top of the low-side MOSFET 25 with one side of the metal clip 26 bent downward to contact to a pin 22 located close to the paddle 20. A high-side MOSFET 27 is attached on the metal clip 20 and another metal clip 28 is attached on the top of the high-side MOSFET 27 with one side of the metal clip 28 bent downward to contact with a pin 21 located close to the paddle 20. Thus, two MOSFETs are electrically connected to the paddle 20 and the pins in a stacking structure as shown in FIG. 2. However, the chip and clip stacking structure in FIG. 2 is so thick and the head dissipation performance is thus poor.

It is within this context that embodiments of the present invention arise.

BRIEF DESCRIPTION OF THE DRAWINGS

As shown in attached drawing, the embodiment of the invention is more sufficiently described. However, the attached drawing is only used for explaining and illustrating rather than limiting the scope of the invention.

DETAILED DESCRIPTION OF THE PREFERRED EMBODIMENTS

Figure 3A:
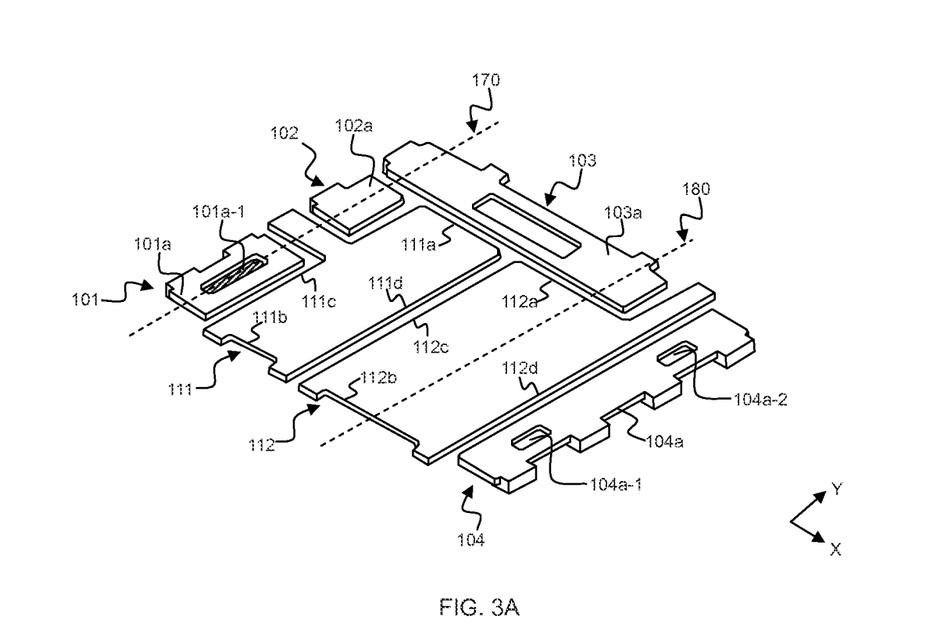
FIGS. 3A and 3B are schematic structural diagrams illustrating the top and the bottom of a lead frame unit of this invention.

FIG. 3A is a schematic diagram of a lead frame unit. Generally, each lead frame strip includes a plurality of such lead frame units; however, only one lead frame unit is described for the sake of simplicity. The lead frame unit includes a first die paddle 111 and a second die paddle 112 separated from each other and the first to the fourth pins 101-104 respectively. The first die paddle 111 and second die paddle 112 are arranged side by side in a same plane. For convenience, the direction of the longer sides of the first or the second die paddle is defined as the longitudinal direction and that of the shorter side is defined as the transverse direction. The first die paddle 111 includes a first transverse edge 111a and second transverse edge 111b opposite to each other, and a first longitudinal edge 111c and a second longitudinal edge 111d opposite to each other. The second die paddle 112 includes a first transverse edge 112a and a second transverse edge 112b opposite to each other and a first longitudinal edge 112c and second longitudinal edge 112d opposite to each other. The second longitudinal edge 111d of the first die paddle 111 is close to and substantially parallel to the first longitudinal edge 112c of the second die paddle 112. The first pin 101 and the second pin 102 are also arranged side by side collinearly and positioned close to the first longitudinal edge 111c of the first die paddle 111 and a connecting rib connected to the first longitudinal edge 111c of the first paddle 111 is arranged between the first pin 101 and the second pin 102, which is used for a mechanical connection between the first die paddle 111 and the lead frame strip (not shown). The third pin 103 includes a strip inner pin 103a locating close to and extending along the first transverse edge 111a of the first die paddle 111 and the first transverse edge 112a of the second die paddle 112 from a straight line 170 along the first pin 101 and the second pin 102 to a straight line 180 located at the center of and parallel to the first longitudinal edge 112c and the second longitudinal edge 112d of the second die paddle 112. The second die paddle 112 includes a connecting rib connected to the first transverse edge 112a at the corner of the first transverse edge 112a and the first longitudinal edge 112d, which is used for a mechanical connection between the second die paddle 112 and the lead frame strip (not show). The fourth pin 104 includes a strip inner pin 104a locating close to and extending along the second longitudinal edge 112d of the second die paddle 112.

Figure 3B:
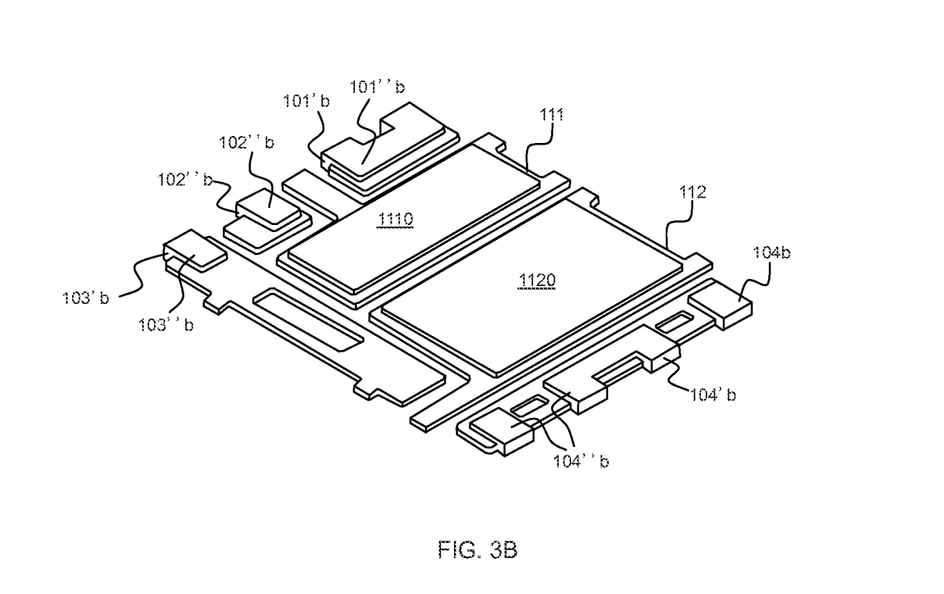

FIG. 3B is a schematic diagram of the flipped lead frame unit in FIG. 3A. In an embodiment, support pads 1110 and 1120 are respectively attached on the bottom surface of the first die paddle 111 and the second die paddle 112. Moreover, each of the first to fourth pins 101-104 also includes one or more outer pins. The outer pin 101b of the first pin 101 is in L shape and includes a bottom horizontal part 101"b positioned on the bottom surface of the inner pin 101a, and a vertical part 101'b positioned on the outer edge of the inner pin 101a. As shown in FIG. 3B, there are two outer pins are attached to the inner pin 101a and the bottom horizontal parts 101"b of these two outer pins 101b is connected together with a connecting part also positioned on the bottom surface of the inner pin 101a between these two outer pins 101b. Similarly, the outer pin 102b of the second pin 102 is in L shape and includes a vertical part 102'b positioned on the outer edge of the inner pin 102a and a bottom horizontal part 102"b positioned on the bottom surface of the inner pin 102a. Similarly, the outer pin 103b of the third pin 103 is in vertical L-shape and includes a vertical part 103'b positioned on the end surface of one end of the third pin 103, which is located on the same straight line 170 along the first pin 101 and the second pin 102 and a bottom horizontal part 103"b locating on an outer area of the bottom surface of the inner pin 103. The inner pin 103a also includes a rectangular through hole at the middle area of the inner pin 103a. Similarly, the outer pin 104b of the second pin 104 is in L-shape and includes a vertical part 104'b positioned on the outer edge of the inner pin 104a and a bottom horizontal part 104"b positioned on the bottom surface of the inner pin 104a. As shown in FIG. 3B, there are four outer pins 104b are attached to the inner pin 104a and the bottom horizontal parts 104"b of the two adjacent outer pins 104b are connected together with a connecting part positioned on the bottom surface of the inner pin 104a between these two outer pins 104b. The bottom surfaces of the bottom horizontal parts 101"b, 102"b, 103"b and 104"b of the outer pins 101b-104b and the support pads 1110 and 1120 are coplanar, which is convenient for the subsequent packaging steps.

Figure 4A:
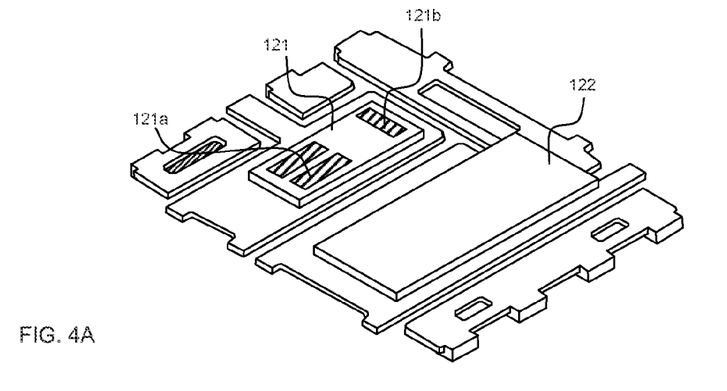
FIGS. 4A and 4B are schematic structural diagrams illustrating the steps of attaching two MOSFETs on the lead frame unit and mounting the metal clips on the MOSFETs.

As shown in FIG. 4A, a first semiconductor chip 121 is attached on the top surface of the first die paddle and a second semiconductor chip 122 is flipped and attached on the inner pin 103a of the third pin 103 and the second die paddle 112. Both of the first chip 121 and the second chip 122 are vertical power MOSFETs, each includes a first electrode (such as source) and a second electrode (such as gate) formed at the front surface of the chip and a third electrode (such as drain) formed at the back surface of the chip and covered with a metal layer. In some applications, the first chip 121 and the second chip 122 can be bare chips. However, the chip packages formed by the method shown in FIGS. 12A to 12F can be ultra-thin due to the support of the plastic package layer, thus the Rdson of the MOSFET is reduced and a bridge type metal clip can be applied, which will be described in details in the following embodiment. The third electrode of the first chip 121 is attached on the first die paddle 111, while the first electrode at the front of the second chip 112 is attached on the top surface of the second die paddle 112, and the second electrode of the second chip 112 is attached on the inner pin 103a of the third pin 103 via a conductive adhesive, such as soldering paste and the likes. The first electrode 121a and the second electrode 121b of the first chip 121 face upward as shown in FIG. 4A. The second chip 122 is flipped, thus the first and second electrodes facing downward, which are not shown in FIG. 4A.

Figure 4B:
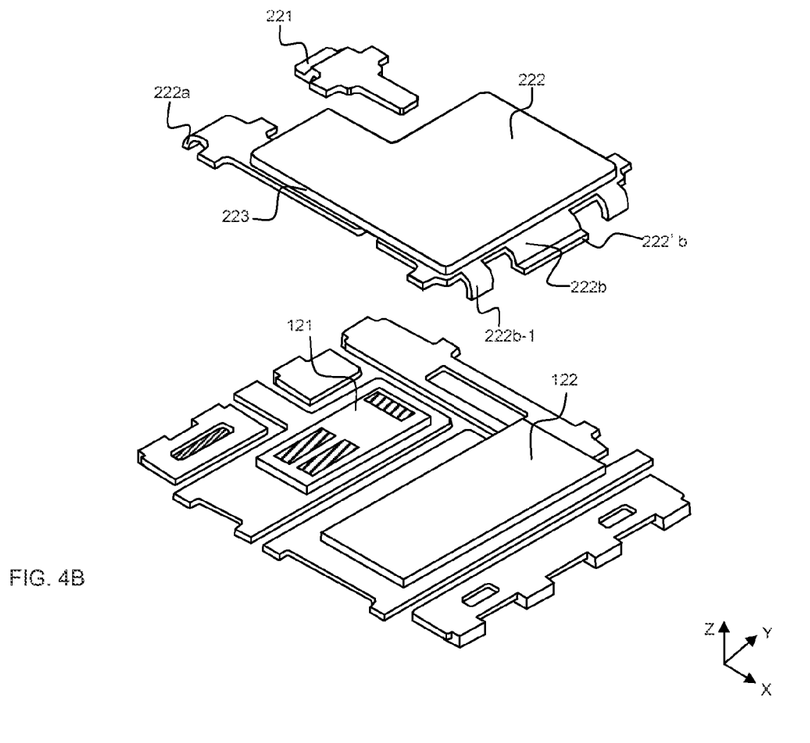

FIG. 4B is a schematic diagram showing a first interconnecting structure, for example a bridge metal clip, which can cover both of the first chip 111 and the second chip 112. The bridge clip includes a main plate 222, a first side wall 222a and a second side wall 222b bent downward and extending along two opposite sides of the main plate 222. Referring to FIG. 7B for another example of a bridge clip, the main plate 222 includes a body part 2222, attached on the first electrode 121a of the first chip 121 and the third electrode at the back of the second chip 122, and a connecting part 2221. The body part 2222 is substantially rectangular shape with two opposite first and second transverse edges 2222a and 2222b and two opposite first and second longitudinal edges 2222c and 2222d, and a rectangular notch is provided in the corner of the first longitudinal edge 2222c and the first transverse edge 2222a forming an L-shaped structure. As shown in FIG. 7B, the connecting part 2221 transversely extends from the first longitudinal edge 2222c of the body part 2222 to the first pin 101 with one end of the connecting part 2221 bent downward forming a first side wall 222a and another end at the second longitudinal edge 2222d of the body part 2222 also bent downward forming a second side wall 222b.

Figure 5A:
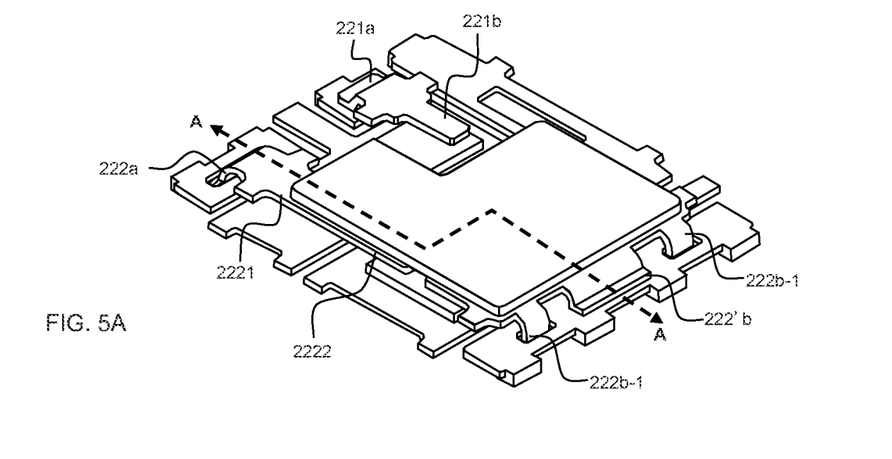
FIG. 5A is a perspective view of a hybrid multi-chip package structure after attaching two MOSFETs on the lead frame unit and mounting the metal clips on the MOSFETs and FIG. 5B is a cross sectional diagram of the structure of FIG. 5A along the line AA.

The first side wall 222a of the main plate 222 of the bridge clip is then mounted on the first pin 101 and the second side wall 222b is then mounted on the fourth pin 104 as shown in FIG. 5A. In one embodiment as shown in FIG. 3A, a longitudinal groove 101a-1 is formed on the top surface of the inner pin 101a for plug in the first side wall 222a of the bridge clip. As shown in FIG. 5A, the first side wall 222a of the bridge clip is aligned and inserted into the groove 101a-1 to prevent from sliding. Conductive adhesive (not shown) can be deposited into the groove 101a-1 to strengthen the mechanical and electrical connection between the first side wall 222a of the bridge clip and the first pin 101. As shown in FIGS. 7B and 5A, the middle part of the second longitudinal edge 2222d of the body part 222 is bent downward to form the second side wall 222b and the two end parts at the two ends of the second longitudinal edge 2222d of the body 222 respectively close to the first and second transverse edges 2222a and 2222b of the body part are bent downward to form two plug pieces 222b-1 separated from the second side wall 222b and located at both sides of the second side wall 222b respectively, where the second side wall 222b comprises a supporting part 222'b at the bottom of the second side wall 222b. As shown in FIG. 3A, the inner pin 104a of the fourth pin 104 includes through holes 104a-1 and 104a-2 close to the two ends of the pin 104. As shown in FIG. 5A, the two plug pieces 222b-1 are correspondingly aligned with and clamped into the two holes 104a-1 respectively to clamp the bridge metal clip to the fourth pin 104 of the lead frame unit, while the supporting part 222'b is attached on the top surface of the inner pin 104a of the fourth pin 104 positioned between the two holes 104a-1 and 104a-2 via a conductive adhesive. Thus, the first electrode 121a at the front surface of the first chip 121 and the third electrode on the back surface of the second chip 112 are electrically connected to the first pin 101 and the fourth pin 104 respectively through the bridge clip.

As shown in FIG. 5A, a second interconnecting structure 221, for example a small metal clip in vertical Z shape formed by stamping or punching a metal plate, includes a high horizontal part 211b and a low horizontal part 221a, where the high horizontal part 211b is attached on the second electrode 121b at the front surface of the first chip 121, while the low horizontal part 221a is attached on the inner pin 102a of the second pin 102 through a conductive adhesive. The advantage of the L shape of the body part 2222 is that the high horizontal part 211b is located in the notch of the body part 2222, as such the device's size is optimized.

Figure 5B:
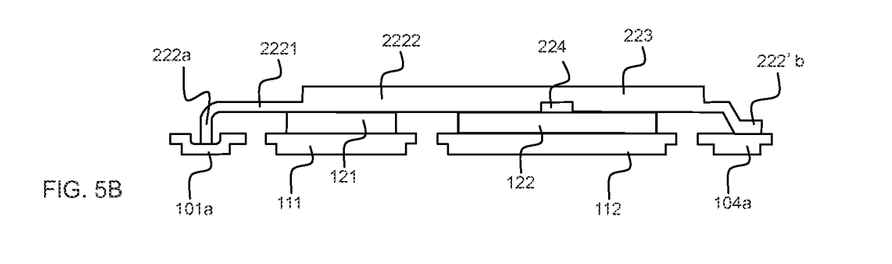

FIG. 5B is a cross sectional diagram of the hybrid packaging multi-chip semiconductor device in FIG. 5A along the dotted line AA, where the structure 223 is the cross section of the body part 2222 in FIG. 5A. A groove 224 is formed on the bottom surface of the body part 2222 at an area that is in contact with the third electrode at the back surface of the second chip 122 with at least one of two ends of the groove 224 extending to the periphery of the body part 2222 for releasing the gas accumulated in the conductive adhesive (such as soldering paste) coated on the back surface of the second chip 122 for attaching the body part 222 on the back surface of the second chip 122, thus reducing the reliability of the electrical performance is avoided. The bridge metal clip can be formed by stamping or punching a metal plate.

Figure 6:
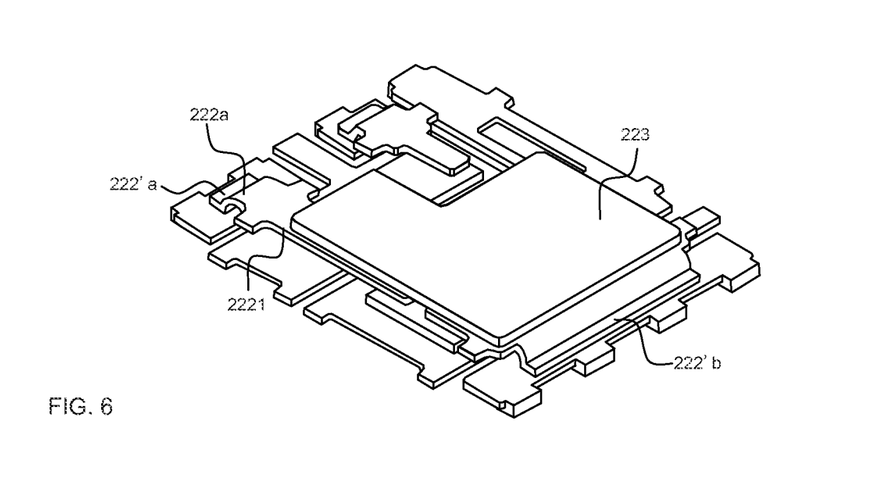
FIGS. 6, 7A and 7B shows alternative embodiments with the bridge clip including different side wall structures.

FIG. 6 shows an alternative hybrid packaging multi-chip semiconductor device. The differences between the bridge metal clip in FIG. 6 and that of FIG. 5A are as follows: in the bridge metal clip in FIG. 6, the first side wall 222a of the connecting part 2221 includes a supporting part 222'a horizontally extending from the bottom of the first side wall 222a to the direction away from first die paddle 111, and the second side wall 222b includes a supporting part 222'b extending from the bottom of the second side wall 222b to the direction away from the second die paddle 112. The differences between the lead frame unit used in FIG. 6 and that of FIG. 3A are that the inner pin 101a of the first pin 101 does not include the groove and the inner pin 104a of the first pin 104 does not include the through holes. As shown in FIG. 6, the supporting parts 222'a and 222'b are mounted on the top surface of the inner pins 101a and 104a of the first pin 101 and fourth pin 105 respectively using a conductive adhesive.

Figure 7A:
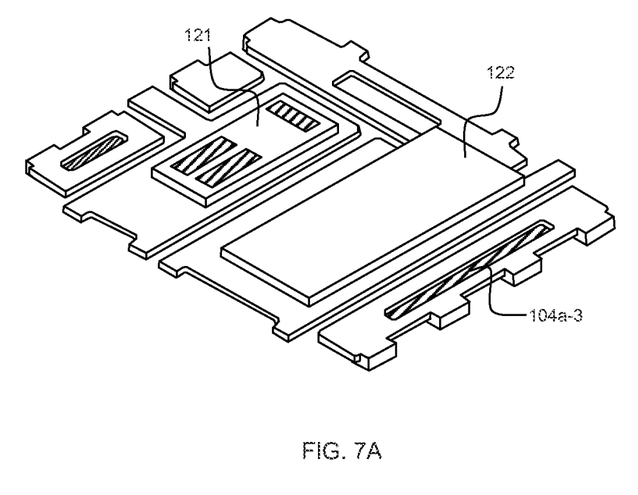
Figure 7B:
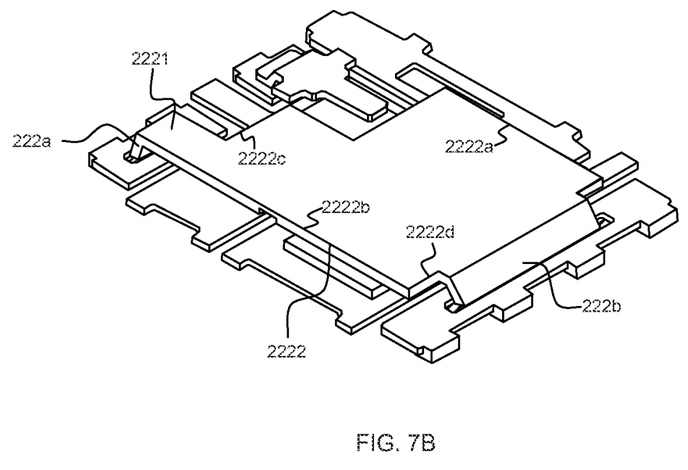

FIGS. 7A to 7B illustrate another alternative hybrid packaging multi-chip semiconductor device. The differences between the lead frame units in FIG. 7A and FIG. 3A are as follows: in the lead frame unit of FIG. 7A, the inner pin 104a of the fourth pin 104 does not include hole but only includes a long strip groove 104a-3 formed on the top surface of the inner pin 104a, where the second side wall 222b of the bridge clip is aligned with and inserted into the groove 104a-3 for plug in the bridge clip to the fourth pin 104. A conductive adhesive (not shown) can be deposited in the groove 104a-3 to strengthen the mechanical and electrical connecting ability between the second side wall 222b and the fourth pin 104.

Figure 8:
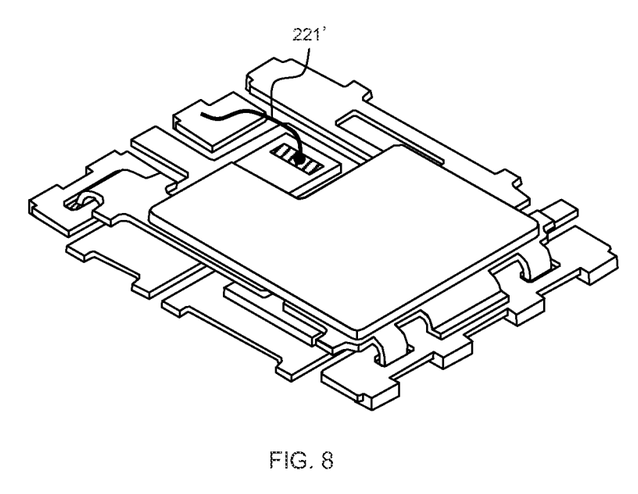
FIG. 8 shows an alternative embodiment with the small clip being replaced by a bonding wire.

FIG. 8 shows another alternative embodiment, in which the small metal clip 221 is replaced by a bonding wire 221'.

Figure 9:
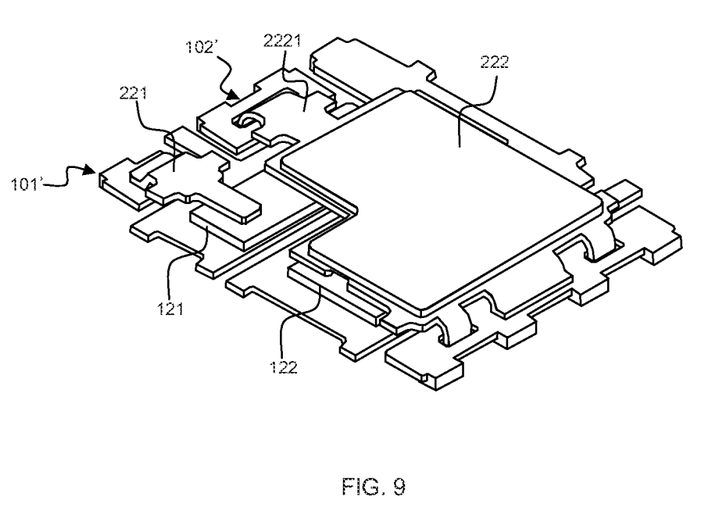
FIG. 9 is a schematic diagram showing an alternative multi-ship package compared with that in FIG. 5A.

FIG. 9 also shows another alternative hybrid packaging multi-chip semiconductor device, in which, compared with the structure of the lead frame unit in FIG. 5A, the structure of the second pin 102' is similar with that of the first pin 101 and the structure of the first pin 101' is similar with that of the second pin 102. In addition, compared with the bridge clip shown in FIG. 5A, the body part 2222 of the bridge clip shown in FIG. 9 includes the L shape at the corner of the first longitudinal edge 2222c and the second transverse edge 2222b (rather than at the corner of the first longitudinal edge 2222c and the first transverse edge 2222a shown in FIG. 5A). As such, the first chip 121 is positioned on the first die paddle 111 differently compared with that shown in FIG. 4A, for example, in FIG. 4A, the first electrode 121a of the first chip 121 is positioned close to the second transverse edge 111b of the first die paddle 111 and the second electrode 121b thereof is close to the first transverse edge 111a of the first die paddle 111; but in FIG. 9, the first electrode 121a of the first chip 121 is close to the first transverse edge 111a of the first die paddle 111 and the second electrode 121b thereof is close to the second transverse edge 111b of the first die paddle 111. As shown in FIG. 9, the connecting part 2221 transversely extends from the first longitudinal edge 2222c of the body part 2222 to the second pin 102' with one end of the connecting part 2221 bent downward forming the first side wall 222a that is aligned with and inserted into the groove formed on the top surface of the inner pin of the second pin 102' to clamp the bridge clip with the second pin 102'. The high horizontal part 221b of the small clip 221 is thus mounted on the second electrode 121b of the first chip 121 and the low horizontal part 221a is mounted on the top surface of the inner pin of the first pin 101'. In FIG. 5A, the connecting part 2221 is located on the position of the first longitudinal edge 2222c close to the second transverse edge 2222b; but in FIG. 9, the connecting part 2221 is located on the position of the first longitudinal edge 2222c close to the first transverse edge 2222a. The advantage of the L shape of the body part 2222 is that the high horizontal part 211b of the small clip 221 is located in the notch of the body part 2222, thus the device's size is optimized. Furthermore, the second electrode 121b is exposed in the notch of the body part 2222. In this embodiment, and the small clip 221 may also be replaced by a bonding wire.

Figure 10A:
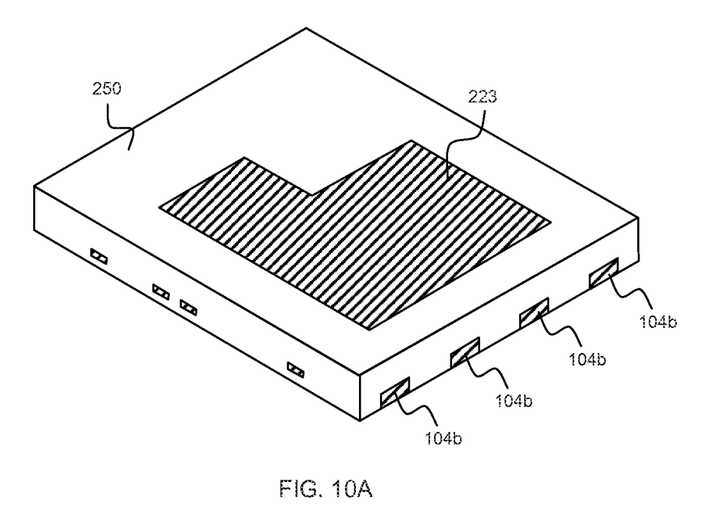
FIGS. 10A and 10B are schematic diagrams of the top and bottom of the multi-chip package in FIG. 5A.
Figure 10B:
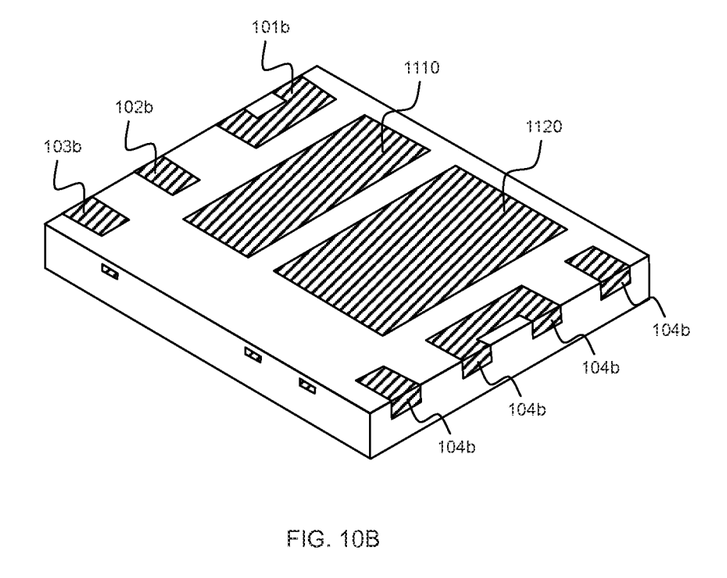

After the first and second chips, the small clip and the bridge clip are mounted on the lead frame unit as described above, a plastic packaging material is deposited to cover the lead frame strip containing a plurality of such lead frame units in the packaging process, and then the lead frame and the plastic packaging material are cut to separate individual hybrid packaging multi-chip semiconductor device. FIGS. 10A and 10B are schematic diagrams from the top surface and from the bottom surface of the hybrid packaging multi-chip semiconductor device after the packaging process. As shown in FIGS. 10A and 10B, the hybrid packaging multi-chip semiconductor device comprises a plastic package body 250 covering the lead frame unit, the first chip 121, the second chip 122, and the first and second interconnecting structures 221 and 222, where the bottom surfaces of the support pads 1110 and 1120 at the respective bottom of the first die paddle 111 and the second die paddle 112, the bottom surfaces of the bottom horizontal parts 101"b-104"b of the respective outer pins 101b-104b of the first to fourth pins 101-104 and the connecting part connecting the bottom horizontal part 104"b of two adjacent outer pins 104b of the fourth pin 104 are exposed out of the bottom surface of the plastic package body 250, and the top surface of the L-shaped structure 223 is exposed out of the top surface of the plastic package body 250.

Figure 11A:
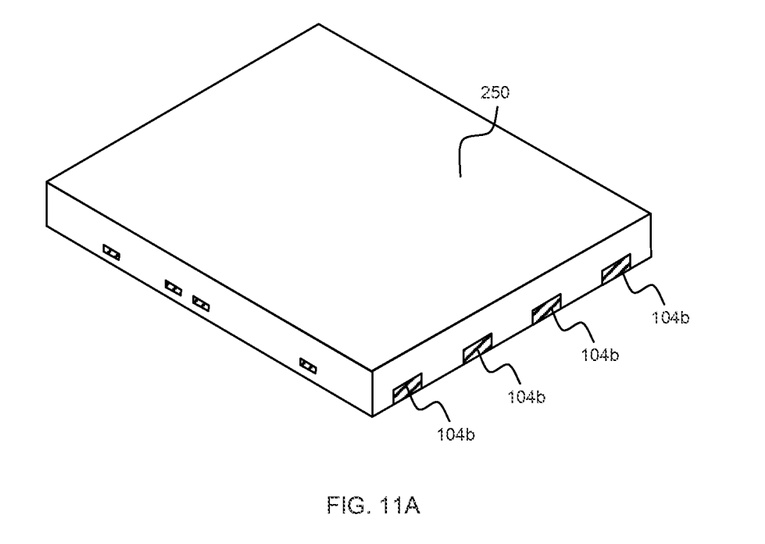
FIGS. 11A to 11B are schematic diagrams of the top and bottom of the multi-chip package in FIG. 7B.
Figure 11B:
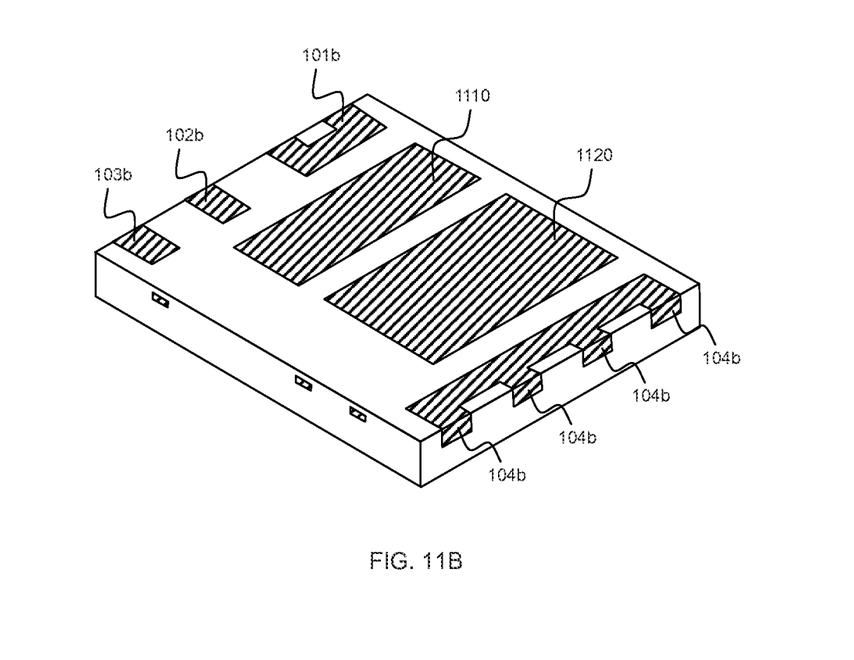

For the bridge clip type used in the hybrid packaging multi-chip semiconductor device structure shown in FIG. 7B, the main plate 222 is not really flat as the structure 223 of the FIG. 5A since the bridge clip of FIG. 7B is directly formed by mechanically stamping or punching; thus, the main plate 222 of the bridge clip of FIG. 7B may be completely covered inside of the plastic package body 250. In another embodiment as shown in FIGS. 11A and 11B, which are the schematic diagrams of the top surface and the bottom surface of the hybrid packaging multi-chip semiconductor device, the bottom surfaces of the support pads 1110 and 1120 at the respective bottom of the first die paddle 111 and the second die paddle 112, the bottom surfaces of the bottom horizontal parts 101"b-104"b of the respective outer pins 101b-104b of the first to fourth pins 101-104, and the connecting part connecting the bottom horizontal part 104"b of all four adjacent outer pins 104b of the fourth pin 104 are exposed out of the bottom surface of the plastic package body 250, while the plastic package body 250 completely covers the top of the hybrid packaging multi-chip semiconductor device.

Figure 12A:
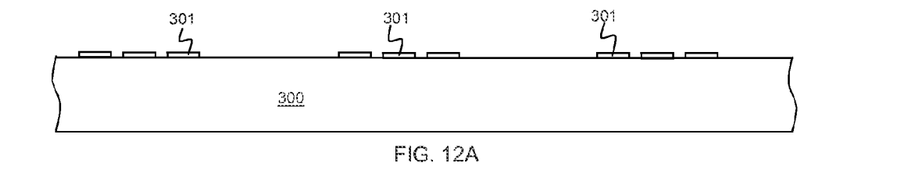
FIGS. 12A to 12F are cross sectional schematic diagram illustrating a method for forming the high-side MOSFET and low-side MOSFET.
Figure 12B:
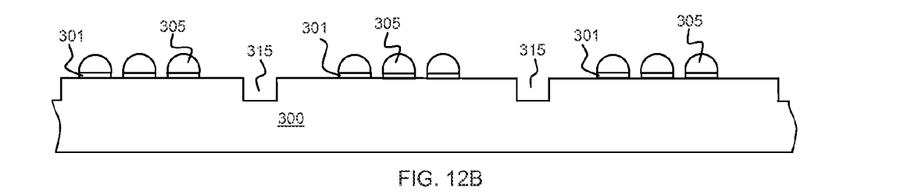
Figure 12C:
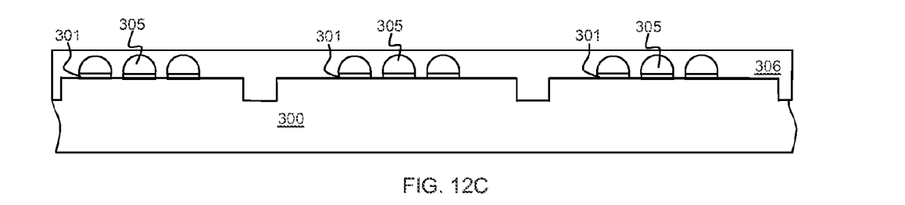
Figure 12D:
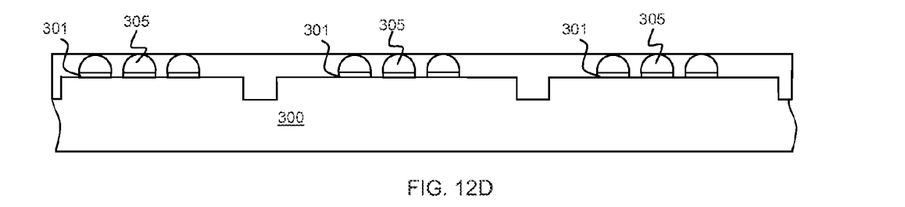
Figure 12E:
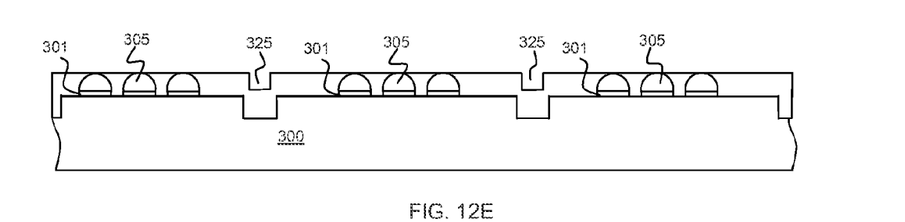
Figure 12F:
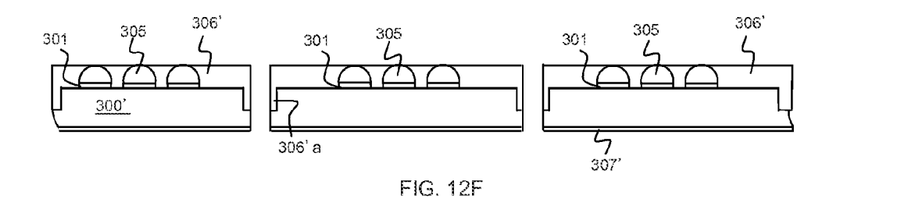
Figure 13A:
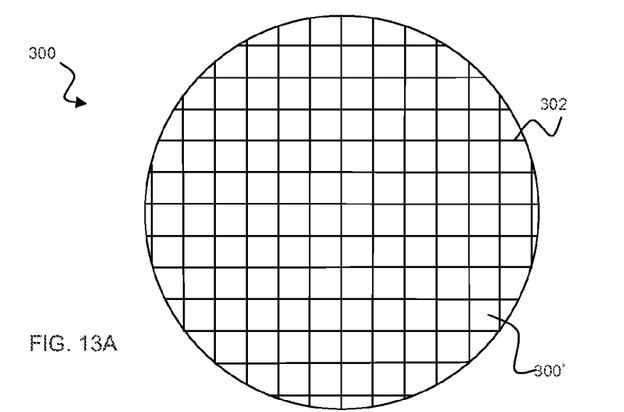
FIGS. 13A to 13C are top views showing the step of covering the front surface of the wafer with a plastic package material and cutting it to separate individual chips.
Figure 13B:
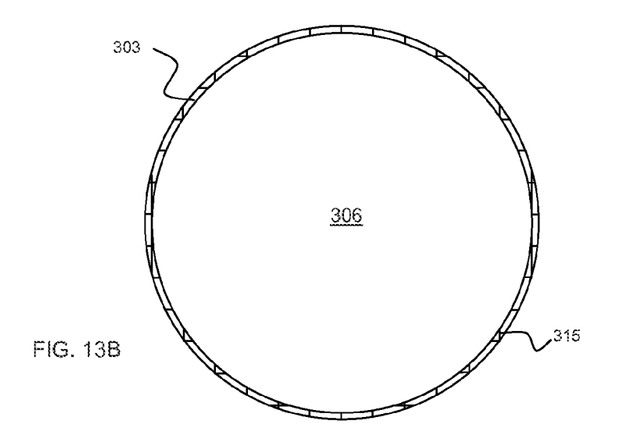
Figure 13C:
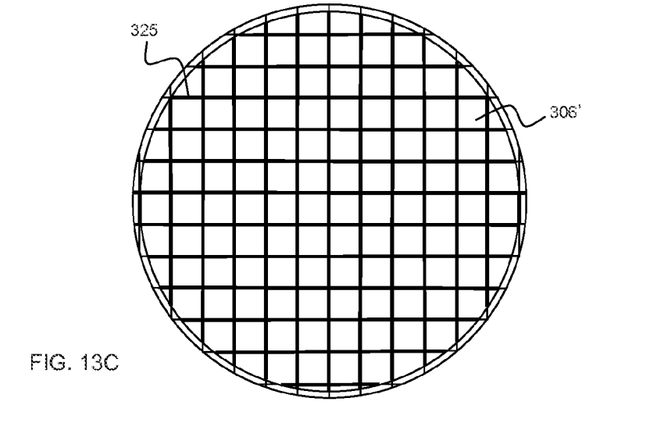

FIGS. 12A to 12F are cross sectional schematic diagrams illustrating a wafer-level method for preparing the first semiconductor chip 121 and the second semiconductor chip 122 on a semiconductor wafer 300. Firstly, a metal pump 305 (such as solder ball or solder paste) is deposited on the electrode pad 301, such as the source electrode pad or gate electrode pad, and then the wafer 300 is cut along a scribe line 302 (see FIG. 13A) at the front surface forming a scribe groove 315 at a top portion of the wafer 300 as shown in FIG. 12B. Then, a plastic package material is deposited to cover the front surface of the wafer 300 forming the plastic package layer 306 covering the metal bump 305 and also filling in the scribe groove 315, as shown in FIG. 12C. The plastic package layer 306 does not cover a ring area 303 at the edge of the front surface of the wafer 300, as shown in FIG. 13B, as such both ends of each scribe line 302 are exposed in the ring area 303. The plastic package layer 306 is ground from the top surface to expose the metal bumps 305, as shown in FIG. 12D. Thus, the plastic package materials filled in each scribe groove 315 are cut through a straight line determined by two ends of a scribe line exposed in the ring area 303 forming a plurality of longitudinal and transverse reference lines 325 on the plastic package layer 306, as shown in FIGS. 12E and 13B, where each reference line 325 is overlapped with the corresponding scribe groove 315 as shown in FIG. 13C. And then, the wafer 300 is ground from the back surface, for example with CMP method. The thin wafer 300 is then covered with a metal layer on the back surface followed by the cutting along the reference line 325 to separate a plurality of chips 300', each of which includes a top plastic package layer 306' formed by cutting the plastic package layer 306 covering the front surface of the chip 300' and a back metal 307' formed by cutting the metal layer covering the back surface of the chip 300'. As shown in FIG. 12F, the top plastic package layer 306' further comprises a side plastic package layer 306'a surrounding the top portion of semiconductor sidewalls of the chip 300' adjacent to the front surface of the chip. The bottom portion of semiconductor sidewalls of chip 300' adjacent to the bottom surface of the chip is not covered by the side plastic package layer 306'a and is coplanar to an outside surface of the side plastic package layer 306'a. If the metal bump 305 is an adhesive, for example a soldering material, the chip is attached on the die paddle or the metal clip directly by the metal bumps. However, if the metal bump 305 is not an adhesive, for example a metal such as copper, an adhesive is used for attaching the chip on the die paddle or the metal clip.

In an embodiment, the first chip 121 is a high-side MOSFET, the metal bump 305 exposed from the top plastic package layer 306' and located on the first electrode is used for attaching to the body part 2222 of the bridge clip, the metal bump 305 exposed from the top plastic package layer 306' and located on the second electrode is used for attaching the small clip 221, while the third electrode 307' is directly attached to the top surface of the first die paddle 111 through a conductive adhesive. Furthermore, the second chip 122 is a low-side MOSFET, the metal bump 305 exposed from the top plastic package layer 306' and located on the first electrode is used for attaching on the second die paddle 112, the metal bump 305 exposed from the top plastic package layer 306' and located on the second electrode is used for attaching to the inner pin 103a, while the third electrode 307' is directly attached to the body part 2222 of the bridge clip through a conductive adhesive. As shown in FIGS. 10A and 11A, the plastic package body 250 also covers the top plastic package layer 306' of the first and second chips 121 and 122.

The above detailed descriptions are provided to illustrate specific embodiments of the present invention and are not intended to be limiting. Numerous modifications and variations within the scope of the present invention are possible. The present invention is defined by the appended claims.

The invention claimed is:

1. A hybrid packaging multi-chip semiconductor device comprising a lead frame unit, a first semiconductor chip, a second semiconductor chip, a first interconnecting structure and a second interconnecting structure, wherein the lead frame unit comprises:

a first die paddle and a second die paddle arranged side by side each having opposite first and second transverse edges and opposite first and second longitudinal edges, the second longitudinal edge of the first die paddle and the first longitudinal edge of the second die paddle define a gap separating the first and second die paddles;

a first pin and a second pin arranged along a straight line and positioned side by side with the first longitudinal edge of the first die paddle;

a third pin comprising a strip inner pin arranged along the first transverse edges of the first die paddle and the second die paddle and, extending from the straight line to a position located between the first longitudinal edge and the second longitudinal edge of the second die paddle;

a fourth pin comprising a strip inner pin arranged along the second longitudinal edge of the second die paddle;

wherein the first semiconductor chip is attached on a top surface of the first die paddle and the second semiconductor chip is flipped and attached on top surfaces of the inner pin of the third pin and the second die paddle, a first electrode and a second electrode formed at a front surface of the second semiconductor chip are electrically connected to the second die paddle and the third pin respectively;

the first interconnecting structure comprising a bridge metal clip overlaying both the first semiconductor chip and the second semiconductor chip, the bridge metal clip includes a main plate and a first side wall and a second side wall bent downward and located at the two opposite sides of the main plate, wherein the first side wall is mounted on either one of the first pin and the second pin and the second side wall is mounted on the fourth pin, a first electrode at a front surface of the first semiconductor chip and a third electrode at a back surface of the second semiconductor chip are electrically connected to each other and to the fourth pin and the first pin or the second pin;

wherein the second electrode at the front surface of the first semiconductor chip is electrically connected through a second interconnecting structure to the other one of the first pin and the second pin that is not electrically connected to the first interconnecting structure.

2. The hybrid packaging multi-chip semiconductor device according to claim 1, wherein the main plate comprises a connecting part and a body part mounted on the first electrode of the first semiconductor chip and the third electrode at the back surface of the second semiconductor chip, the body part comprises a notch forming an L-shaped structure at a corner of a first longitudinal edge and a first or the second transverse edge to expose a second electrode at the front surface of the first semiconductor chip;

the connecting part transversely extends from the first longitudinal edge of the body part to the first or the second pin, one end of the connecting part is bent downward forming the first side wall, while the second side wall is formed by bending downward the second longitudinal edge of the body part.

3. The hybrid packaging multi-chip semiconductor device according to claim 2, wherein the second interconnecting structure comprises a small metal clip with a vertical Z-shaped structure including a high horizontal part located at the notch of the first interconnecting structure and attached on the second electrode at the front surface of the first semiconductor chip and a low horizontal part attached on an inner pin of either one of the first pin or the second pin.

4. The hybrid packaging multi-chip semiconductor device according to claim 2, wherein a middle part at the second longitudinal edge of the body part is bent downward to form the second side wall and two end parts at the second longitudinal edge of the body part are bent downward to form two plug pieces separated from the second side wall and positioned at both sides of the second side wall;
   wherein two through holes are respectively formed on two end areas of the inner pin of the fourth pin for plug in the two plug pieces of the bridge metal clip; and
   a bottom of the second side wall connects with a flat support part mounted on the top surface of the inner pin of the fourth pin positioned between the two through holes.

5. The hybrid packaging multi-chip semiconductor device according to claim 2, wherein a groove is formed at a bottom surface of the body part on an area contacting with the third electrode at the back surface of the second chip with both ends of the groove extending to the periphery of the body part.

6. The hybrid packaging multi-chip semiconductor device according to claim 1, wherein the second interconnecting structure comprises a bonding wire with one end bonded on the second electrode at the front surface of the first chip and the other end bonded on the inner pin of either one of the first pin or the second pin not connected to the first side wall of the bridge metal clip.

7. The hybrid packaging multi-chip semiconductor device according to claim 1, wherein a longitudinal strip groove is formed on the top surface of the inner pin of the first pin or the second pin for plug in a part of the first side wall of the bridge metal clip.

8. The hybrid packaging multi-chip semiconductor device according to claim 1, wherein a bottom of the first side wall connects to a flat supporting part mounted on the top surface of the inner pin of either one of the first pin or the second pin for fastening the first side wall.

9. The hybrid packaging multi-chip semiconductor device according to claim 1, wherein a longitudinal strip groove is formed on the top surface of the inner pin of the forth pin for plug in a part of the second side wall of the bridge metal clip.

10. The hybrid packaging multi-chip semiconductor device according to claim 1, wherein a bottom of the second side wall comprises a flat supporting part mounted on the top surface of the inner pin of the fourth pin.

11. The hybrid packaging multi-chip semiconductor device according to claim 1, wherein a bottom surface of each of the first die paddle and the second die paddle is attached with a support pad; and
   wherein each of the first pin, second pin, third pin and fourth pin comprises an outer pin comprising a bottom horizontal part arranged on the bottom surface of the inner pin with a bottom surface of the bottom horizontal part of the respective outer pin of the first pin, second pin, third pin and fourth pin coplanar with the bottom surface of the support pad of the first die paddle and the second die paddle.

12. The hybrid packaging multi-chip semiconductor device according to claim 11, wherein an L-shaped body part of the bridge metal clip comprises an L-shape mesa of reduced size with each edge of the mesa recessed from a respective edge of the L-shape body part.

13. The hybrid packaging multi-chip semiconductor device according to claim 12 further comprising a plastic package body encapsulating the lead frame unit, the first semiconductor chip, the second semiconductor chip, the first interconnecting structure and the second interconnecting structure, wherein the bottom surface of the support pads of the first die paddle and the second die paddle and the bottom surfaces of the bottom horizontal parts of the first pin, second pin, third pin and fourth pin are exposed out of a bottom surface of the plastic package body; and the top surface of the L-shaped mesa of the bridge metal clip is exposed out of a top surface of the plastic package body.

14. The hybrid packaging multi-chip semiconductor device according to claim 11 further comprising a plastic package body encapsulating the lead frame unit, the first semiconductor chip, the second semiconductor chip, the first interconnecting structure and the second interconnecting structure, wherein the bottom surfaces of the support pads of the first die paddle and the second die paddle and the bottom surfaces of the bottom horizontal parts of the first pin, second pin, third pin and fourth pin are exposed out of the bottom surface of the plastic package body.

15. The hybrid packaging multi-chip semiconductor device according to claim 1, wherein the first and second semiconductor chips each comprises a first plastic package layer on the front face with metal bumps connected to the first and second electrodes exposed on a top surface of the first plastic package layer electrically connecting to the first interconnecting structure, the second interconnecting structure, the second die paddle and the third pin respectively.

16. The hybrid packaging multi-chip semiconductor device according to claim 15 wherein the first plastic package layer further comprises a side plastic package layer surrounding a portion of semiconductor sidewalls adjacent to the front surfaces of the first or second semiconductor chip.

17. The hybrid packaging multi-chip semiconductor device according to claim 16 wherein an outside surface of the side plastic package layer coplanar to a portion of semiconductor sidewalls adjacent to the back surface of the first or second semiconductor chip.

18. The hybrid packaging multi-chip semiconductor device according to claim 15 further comprising a plastic package body encapsulating the lead frame unit, the first semiconductor chip, the second semiconductor chip, the first interconnecting structure and the second interconnecting structure, wherein a bottom surface of the first die paddle and the second die paddle and bottom surfaces of the first pin, second pin, third pin and fourth pin are exposed out of a bottom surface of the plastic package body.

\* \* \* \* \*